Dec. 2, 1969

C. F. McVOY, JR 3,482,032

HOUSING FOR ELECTRICAL APPARATUS HAVING
MEANS TO ACCOMMODATE ELECTRICAL LEADS

Filed Aug. 23, 1967

INVENTOR:
CHARLES F. McVOY, JR.

BY James E. Espe
HIS ATTORNEY.

United States Patent Office 3,482,032
Patented Dec. 2, 1969

3,482,032
HOUSING FOR ELECTRICAL APPARATUS HAVING MEANS TO ACCOMMODATE ELECTRICAL LEADS

Charles F. McVoy, Jr., Danville, Ill., assignor to General Electric Company, a corporation of New York Filed Aug. 23, 1967, Ser. No. 662,619
Int. Cl. H02g *3/18*
U.S. Cl. 174—65 14 Claims

ABSTRACT OF THE DISCLOSURE

A housing for electrical components, such as ballast components for starting and operating electric discharge lamps, having a slot to allow electrical leads or conductors to pass through the housing. Retaining means are received within a portion of the slot to secure the leads in place and to close that portion of the slot not occupied by the leads.

BACKGROUND OF THE INVENTION

This invention relates generally to a housing for electrical components such as, for example, ballast components for starting and operating electrical discharge lamps. More specifically, it relates to an improved means to accommodate electrical leads extending from the components and through the housing for connection exteriorly thereof.

Although the present invention is not necessarily limited to use with a ballast for starting and operating electric discharge lamps, it is believed the background of the invention will be better understood if discussed in connection with such ballasts.

In the production of the ballast, electrical components such as, for example, a core and coil assembly, a capacitor and other components, are assembled into a unitary structure and then inserted into a case or housing. In the past, the housing was provided with an opening through which electrical leads were threaded from outside the housing and then connected to the unitary structure. Because connection of the leads took place within the housing, automatic soldering equipment could not be satisfactorily employed to effect the connection. In order to utilize the automatic soldering equipment, it is possible to solder the connections prior to insertion of the components into the housing with subsequent threading of the leads out through the openings from inside the housing. A problem is encountered in this procedure, however, in that the length of the leads are from two feet to six feet long and the spacing between the housing wall, in which the opening is disposed, and the points of connection of the leads to the components is approximately one-half inch. This relatively small space not only makes it awkward to thread the leads through the opening from inside the housing but also frequently results in kinking of the leads and possible breakage of the conductor wire. If the openings are enlarged to facilitate threading from the inside, potting compound, which is poured into the housing following assembly of the components and leads, will seep through the enlarged openings.

Thus, it would be desirable to provide, in a housing for electrical components, means to accommodate electrical leads passing therethrough which will allow automated connection of the leads to the components but at the same time obviate threading of the leads through an opening in cramped quarters as well as provide a seal to prevent subsequent leakage of a potting compound from the housing.

SUMMARY OF INVENTION

It is an object of this invention to provide an improved housing for electrical components which will permit electrical leads to be connected to the components prior to the insertion of the components into the housing and which will permit the leads to be quickly and easily brought outside the housing.

It is another object of this invention to provide such improved housing which will minimize leakage of potting compound from the housing.

It is an additional object of the present invention to provide an improved housing for electrical components which is readily adapted to automated or semi-automated assembly techniques.

Briefly stated, in accordance with one aspect of the present invention, an improvement is provided for a housing within which electrical components are disposed and through which electrical leads must pass to allow electrical connection to said electrical components from outside said housing, said housing comprising a plurality of interconnecting walls defining a box-like structure having an open wall and a cover member to cover said open wall and thus provide a substantially totally enclosed housing. This improvement comprises a first slot, in at least one of the walls, opened toward the edge of the one wall adjacent the open wall. A second slot intersects the first slot and is adapted to receive the leads and is of a size whereby the leads consume substantially the entire area of the second slot. Retaining means are received within the first slot to retain the conducting leads in the second slot and to substantially entirely close the first slot.

In another embodiment of the invention the improvement comprises two spaced flanges disposed adjacent the edge of at least one of the end walls of the housing. A lead-receiving slot is provided in that wall and extends to the edge and opens between the flanges. The leads are disposed within the slot and occupy a portion thereof. Means are provided to close substantially all the portion of the slot not occupied by the leads.

BRIEF DESCRIPTION OF THE DRAWING

While the specification concludes with claims particularly pointing out and distinctly claiming the subject matter which is regarded as the invention, it is believed the invention will be better understood from the following description of the preferred embodiments taken in connection with the accompanying drawing, in which:

DESCRIPTION OF THE PREFERRED EMBODIMENTS

Figures 1, 2, 3, 4, 5, 6, 7, 8, 9:
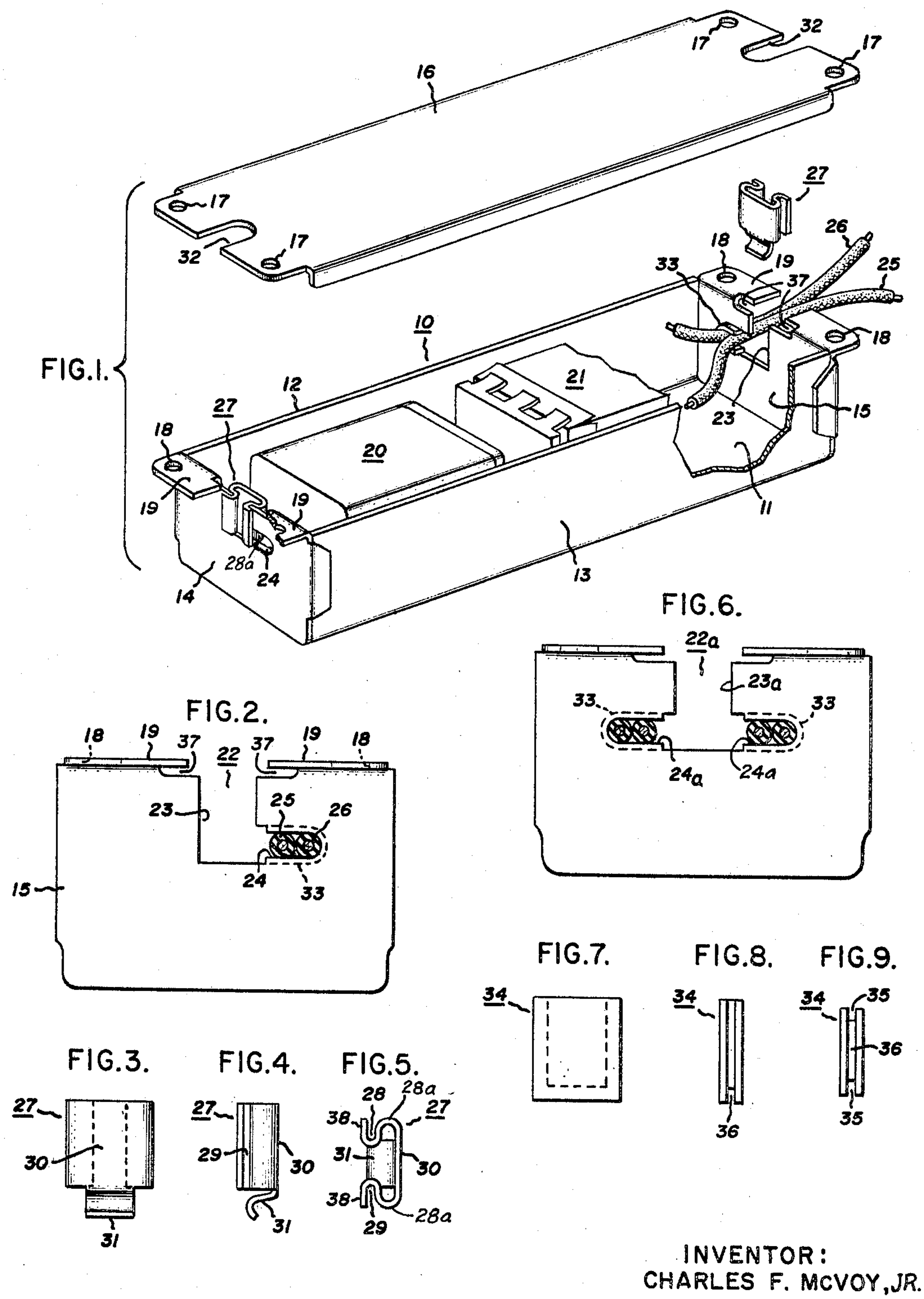
FIGURE 1 is an exploded perspective view of a housing for electrical components utilizing the present invention.
FIGURE 2 is an end elevational view of the housing of FIGURE 1.
FIGURES 3, 4 and 5 are enlarged detailed views of the retaining means of present invention.
FIGURE 6 is a view similar to FIGURE 2 but showing another embodiment of the present invention.
FIGURES 7, 8 and 9 are views similar to FIGURES 3, 4 and 5 but show another embodiment of the retaining means of the present invention.

Referring now to the drawing, and initially to FIGURE 1 thereof, there is illustrated a housing comprising a box-like structure 10 having a bottom wall 11, side walls 12 and 13, and end walls 14 and 15. Structure 10 has an open wall opposite bottom wall 11 which is closed by a cover member 16. Cover member 16 has four holes 17 therethrough which are aligned with four holes 18 in flanges 19 bent out from end walls 14 and 15. Bolts, rivets or similar fastening devices may be passed through holes 17 and 18 to secure cover member 16 to structure 10 or the metal of the cover may be extruded at holes 17 and then rolled over after entering holes 18 to form self-eyelets.

Structure 10 is adapted to receive and contain electrical components. By way of example, FIGURE 1 illustrates electrical components comprising a ballast for starting and operating electric discharge lamps, such as fluorescent tubes. These components include a capacitor 20 and a core and coil assembly 21. As mentioned above, it is necessary to provide electrical leads to electrically connect the components within the housing to a power source and/or a load external of the housing.

In accordance with the present invention, means are provided to accommodate the leads and to allow them to pass through the housing. This means includes a lead receiving slot 22 which may comprise a first slot 23 opened toward the edge of end wall 15 adjacent the open wall, and a second slot 24 intersecting first slot 23. The width and depth of slot 23 is such to allow convenient insertion of leads therethrough and into slot 24. Slot 24 is of a size whereby leads, such as leads 25 and 26, substantially entirely consume slot 24.

Means are provided to retain leads 25 and 26 in slot 24. In one embodiment of the present invention, this retaining means comprises a clip 27. Clip 27 has contoured wall-engaging surfaces 28 and 29 which are in the form of generally parallel oppositely facing grooved elements interconnected by a web portion 30. Surfaces 28 and 29 are adapted to engaged the edges of the wall defining lead receiving slot 22 with web 30 being disposed within structure 10, i.e., adjacent the inner surface of the wall. An element 31 projects from the bottom edge of web 30 and is adapted to engage and bear against the inner surface of the housing wall to secure clip 27 within lead receiving slot 22. Element 31 is of a width slightly less than the width of slot 23 whereby element 31 can pass within slot 23 as clip 27 is inserted into the slot. As clip 27 approaches its ultimate location within slot 23, element 31 engages the inner surface of the wall immediately below slot 23 and, as clip 27 is further manually inserted, element 31 provides a slightly interfering, and thus securing, relationship with the wall adjacent the slot.

Clip 27 substantially closes first slot 23 or, stated in another manner, clip 27 substantially closes that portion of lead receiving slot 22 not occupied by leads 25 and 26. In addition to serving to retain leads 25 and 26 in their desired location within slot 24, clip 27 serves to prevent leakage of potting compound from the interior of structure 10 as the potting compound is poured into structure 10 during encapsulation of the electrical components. In a ballast for starting and operating electric discharge devices, such as fluorescent lamps, a common potting compound is sand-filled asphalt which, during the potting operation, is heated to a point where it will pour without difficulty, i.e., to a temperature of approximately 210° C. It will be appreciated, that even at this temperature the sand-filled asphalt is relatively viscous and, as it cools immediately following the potting operation, it becomes even more viscous. Accordingly, it is unnecessary to provide the slots and clip with a relationship wherein they are absolutely liquid-tight since the viscosity of the asphalt wil prevent, or substantially minimize, leakage of the potting compound even though small spaces exist.

Cover member 16 is provided with a pair of slots 32 which, when cover member 16 is assembled to box-like structure 10, align themselves with the space between flanges 19. Slots 32, and the spaces between flanges 19, provide means for the assembled structure 10 to be subsequently mounted to an apparatus such as a fluorescent lamp fixture. This assembly is normally performed with a power wrench which must slip over the end of a screw or bolt, passing thru slot 32 and the space between flanges 19, without meeting interference adjacent the outer surface of end walls 14 or 15. It should be noted that clip 27, due to its unique configuration, provides clearance for such power tool because web 27 is disposed within structure 10.

FIGURE 6 illustrates that the present invention can be utilized to accommodate a relatively large number of leads by forming lead receiving slot 22 in the shape of an inverted T rather than an L as illustrated in FIGURE 2. The lead receiving slot 22*a* of FIGURE 6 comprises a first slot 23*a* and a pair of second slots 24*a*. With this arrangement, clip 27 simply sits down between slots 24*a*, and the leads disposed therein, to serve the same function as that discussed above with regard to the embodiment illustrated in FIGURES 1 and 2.

During the forming of slots 24 and slots 24*a*, the material forming the walls within which the slots are formed, is rolled or extruded inwardly adjacent the slots, as indicated at 33, to provide a rolled lip. This rolled lip protects the insulation of the leads passing therethrough to minimize damage to the insulation which could occur if a sharp or narrow edge existed. Clip 27 is formed so that one of the rolled or curved edges 28*a* contacts the leads to complete entrapment of the leads by rolled or curved surfaces on all sides. To further minimize the possibility of damage to the lead insulation, the dimension between the outer edges of tips 38 is less than the dimension between outer extremities of edges 28*a* thus insuring that the curved edges 28*a* serve to secure the leads within the slots rather than the relatively sharp edges of tips 38.

Referring now to FIGURES 7, 8 and 9, there is shown a modification of the retaining means which comprises a member 34 having slots 35 in opposite edges thereof and a third slot 36 in at least one end thereof. In this embodiment, member 34 is adapted to be inserted into lead-receiving slot 22 with slots 35 receiving the edges of the wall defining slot 23 at each side thereof and slot 36 receiving the edge defining the bottom of slot 23. Although member 34 is not as desirable as clip 27, due to the advantages of providing clearance for a power tool as discussed above, member 34 will adequately retain the leads and close off the slot. Member 34 may be constructed from any suitable thermoplastic material such as nylon.

With the arrangement thus far described, it is apparent that the present invention lends itself for use with automated and semi-automated assembly techniques. Specificaly, leads 25 and 26 may be connected to core and coil assembly 21 by automatic soldering equipment prior to installation into structure 10. Similarly, leads (not shown) may be connected to capacitor 20 by automatic soldering equipment prior to installation in structure 10. When the connected electrical components and lears meet structure 10 at the assembly line, they may be assembled into structure 10 with the leads being slipped down through slot 23 and slot 24 without necessitating threading through a relatively small opening. Thus, even with leads having a length of six feet, assembly is relatively straightforward and uncomplicated. Following insertion of the leads into slot 24, retaining means, either clip 27 or member 34, is inserted into slot 23 to close slot 23 and retain the leads in slot 24. Following this, cover member 16 is assembled onto structure 10 with suitable securing means passing through openings 17 in cover member 16 and openings 18 in flanges 19.

It should be noted that cover member 16 overlies the retaining means to provide additional security against loosening and escape of the retaining means after it has been installed. In the case of clip 27, this complements the securing feature of element 31. Flanges 19 are provided with notches 37 which allow passage of tips 38 on clip 27 during assembly of clip 27 to structure 10.

Thus it can be seen that the present invention provides, in a housing for electrical components, means to accommodate electrical leads passing therethrough which will allow automated connection of the leads to the components but at the same time obviate threading of the leads through an opening as well as provide a seal to prevent subsequent leakage of a potting compound from the housing. The present invention, in one embodiment, further insures that only rolled or curved surfaces contact the electrical leads thus minimizing damage to the insulation on the leads.

As will be evident from the foregoing description, certain aspects of the invention are not limited to the particular details of construction of the examples illustrated, and it is contemplated that various other modifications or applications will occur to those skilled in the art. It is therefore intended that the appended claims shall cover such modifications and applications as do not depart from the true spirit and scope of the invention.

What I claim as new and desire to secure by Letters Patent of the United States is:

1. In a housing within which electrical components are disposed and through which electrical leads must pass to allow electrical connection to said electrical components from outside said housing, said housing comprising a plurality of interconnecting walls defining a box-like structure having an open wall and a cover member to cover said open wall and thus provide a substantially totally enclosed housing, the invention comprising:

(a) a first slot in at least one of said walls opened toward the edge of said one wall adjacent said open wall, (b) a second slot intersecting said first slot and adapted to receive said leads and being of a size whereby said leads consume substantially the entire area of said second slot, and (c) retaining means received within said first slot to retain said leads in said second slot and to substantially entirely close said first slot.

2. The invention of claim 1 wherein said second slot has first and second portions respectively disposed on opposite sides of said first slot.

3. The invention of claim 1 wherein said leads are coated with an electrical insulation and said second slot is provided with rolled edges to minimize the possibility of damage to said insulation from contact with the edge of said slot.

4. The invention of claim 1 wherein said retaining means comprises a clip having means to position and secure said clip relative to said one of said walls.

5. The invention of claim 4 wherein the edges of said clip which contact said leads are rolled to present a smooth surface to said leads thereby preventing damage to said leads

6. The invention of claim 4 wherein said means to position and to secure comprises integrally formed grooves which receive the edges of the said wall of housing which define said first slot.

7. The invention of claim 6 wherein said means to position and to secure further comprises a projecting element adapted to engage the interior surface of said one of said walls and bear there against to secure said retaining means within said first slot.

8. The invention of claim 7 wherein said projecting element has a width slightly less than the width of said first slot.

9. The invention of claim 1 wherein said electrical compoents include a ballast for starting and operating electrical discharge lamps, said housing is filled with a potting compound, and said retaining means further serves to seal said first slot against leakage of potting compound from said housing during the potting operation.

10. In a housing within which electrical components are disposed and through which electrical leads must pass to allow electrical connection to said electrical components from outside said housing, said housing comprising a bottom wall, two side walls and two ends walls defining a box-like structure having an open wall opposite said bottom wall, a cover member to close said open wall and thus provided a substantially totally enclosed housing, the invention comprising:

(a) two spaced flanges disposed adjacent the edge of at least one of said end walls, said edge being adjacent said open wall, (b) a lead-receiving slot in said one of said end walls having a closed end and an open end, said open end extending to said edge and opening between said flanges, (c) said leads being disposed in said slot and occupying a portion thereof adjacent said closed end, and (d) means insertable into said slot adjacent said open end to close substantially all the portion of said slot not occupied by said leads.

11. The invention of claim 10 wherein said means comprises a clip having integrally formed contoured wall-engaging surfaces.

12. The invention of claim 10 wherein said means comprises a clip having a pair of generally parallel oppositely facing groove elements inter-connected by a web portion, said groove elements being spaced from each other a distance substantially equal to the width of said lead-receiving slot adjacent said flanges.

13. In a housing within which electrical components are disposed and through which electrical leads must pass to allow electrical connection to said electrical components from outside said housing, said housing comprising a bottom wall, two side walls and two ends walls defining a box-like structure having an open wall opposite said bottom wall, a cover member to close said open wall and thus provided a substantially totally enclosed housing, the invention comprising:

(a) two spaced flanges disposed adjacent the edge of at least one of said end walls, said edge being adjacent said open wall, (b) a lead-receiving slot in said one of said end walls extending to said edge and opening between said flanges, (c) said leads being disposed in said slot and occupying a portion thereof, and (d) a clip insertable into said slot to close substantially all the portion of said slot not occupied by said leads, said clip having a pair of generally parallel oppositely facing groove elements interconnected by a web portion, said groove elements being spaced from each other a distance substantially equal to the width of said lead-receiving slot adjacent said flanges, and said clip having curved surfaces between said web and said groove elements with said curved surfaces defining the greatest width of said clip whereby said curved surfaces are the only surfaces of said clip to contact said leads.

14. In a housing within which electrical components are disposed and through which electrical leads must pass to allow electrical connection to said electrical components from outside said housing, said housing comprising a bottom wall, two side walls and two ends walls defining a box-like structure having an open wall opposite said bottom wall, a cover member to close said open wall and thus provided a substantially totally enclosed housing, the invention comprising:

(a) two spaced flanges disposed adjacent the edge of at least one of said end walls, said edge being adjacent said open wall, (b) a lead-receiving slot in said one of said end walls having a closed end and an open end, said open end extending to said edge and opening between said flanges, (c) said leads being disposed in said slot and occupying a portion thereof, and (d) a clip insertable into said slot to close substantially all the portion of said slot not occupied by said leads, said clip having a pair of generally parallel oppositely facing groove elements interconnected by a web portion, said groove elements being spaced from each other a distance substantially equal to the width of said lead-receiving slot adjacent said flanges, and said clip having an element, projecting from said web portion, of slightly less width than said lead-receiving slot adapted to engage and bear against the inner surface of said one of said end walls to secure said clip within said lead-receiving slot.

References Cited

UNITED STATES PATENTS

| | | | |
|---|---|---|---|
| 3,229,026 | 1/1966 | Sulzer | 174—65 |
| 3,329,762 | 7/1967 | Miller | 174—65 |

LEWIS H. MYERS, Primary Examiner

D. A. TONE, Assistant Examiner

U.S. DEPARTMENT OF COMMERCE

PATENT OFFICE

Washington, D.C. 20231

UNITED STATES PATENT OFFICE

CERTIFICATE OF CORRECTION

Patent No. 3,482,032 December 2, 1969

Charles F. McVoy, Jr.

It is certified that error appears in the above identified patent and that said Letters Patent are hereby corrected as shown below:

Column 6, line 5, "provided" should read -- provide --. Column 7, line 6, after "distance" insert -- being --.

Signed and sealed this 6th day of October 1970.

(SEAL)
Attest:

Edward M. Fletcher, Jr.
Attesting Officer

WILLIAM E. SCHUYLER, JR.
Commissioner of Patents

UNITED STATES PATENT OFFICE
CERTIFICATE OF CORRECTION

Patent No. 3,482,032 December 2, 1969

Charles F. McVoy, Jr.

It is certified that error appears in the above identified patent and that said Letters Patent are hereby corrected as shown below:

Column 6, lines 70 to 73, "(b) a lead-receiving slot in said one of said end walls having a closed end and an open end, said open end extending to said edge and opening between said flanges," should read -- (b) a lead-receiving slot in said one of said end walls extending to said edge and opening between said flanges, --.

Signed and sealed this 10th day of November 1970.

(SEAL)
Attest:

Edward M. Fletcher, Jr.
Attesting Officer

WILLIAM E. SCHUYLER, JR.
Commissioner of Patents